United States Patent
Kim et al.

(10) Patent No.: US 11,309,228 B2
(45) Date of Patent: Apr. 19, 2022

(54) PACKAGED SEMICONDUCTOR DEVICES HAVING ENHANCED THERMAL TRANSPORT AND METHODS OF MANUFACTURING THE SAME

(71) Applicant: Samsung Electronics Co., Ltd., Suwon-si (KR)

(72) Inventors: Sunchul Kim, Hwaseong-si (KR); Taehun Kim, Asan-si (KR); Pyoungwan Kim, Suwon-si (KR)

(73) Assignee: Samsung Electronics Co., Ltd.

( * ) Notice: Subject to any disclaimer, the term of this patent is extended or adjusted under 35 U.S.C. 154(b) by 36 days.

(21) Appl. No.: 16/908,128

(22) Filed: Jun. 22, 2020

(65) Prior Publication Data
US 2021/0104446 A1    Apr. 8, 2021

(30) Foreign Application Priority Data
Oct. 8, 2019    (KR) ........................ 10-2019-0124349

(51) Int. Cl.
*H01L 23/367*    (2006.01)
*H01L 23/31*    (2006.01)
(Continued)

(52) U.S. Cl.
CPC ........ *H01L 23/367* (2013.01); *H01L 23/3107* (2013.01); *H01L 21/4871* (2013.01); *H01L 23/3135* (2013.01); *H01L 23/3736* (2013.01)

(58) Field of Classification Search
CPC ............... H01L 23/367; H01L 23/3107; H01L 23/4334; H01L 2225/06558;
(Continued)

(56) References Cited

U.S. PATENT DOCUMENTS 6,432,749 B1    8/2002   Libres
8,278,743 B2    10/2012  Fukuda et al.
(Continued)

FOREIGN PATENT DOCUMENTS

JP    4978054    4/2012
JP    5633210    10/2014
(Continued)

OTHER PUBLICATIONS

US 10,297,529, 9/1988, Johnson et al. (withdrawn)

Primary Examiner — Patricia D Valenzuela
(74) Attorney, Agent, or Firm — Myers Bigel, P.A.

(57) ABSTRACT

A packaged semiconductor device includes a package substrate, a first semiconductor device on the package substrate, and at least one second semiconductor device that extends on and partially covers the first semiconductor device. A heat dissipating insulation layer is provided as a coating on the first and second semiconductor devices. A conductive heat dissipation member is provided, which extends upwardly from the heat dissipating insulation layer and on portions of the first and second semiconductor devices. A protective member is provided on the package substrate, to cover the first and second semiconductor devices and the conductive heat dissipation member. This protective member includes a first covering portion, which covers an upper surface of the conductive heat dissipation member.

18 Claims, 13 Drawing Sheets

(51) Int. Cl.
*H01L 21/48* (2006.01)
*H01L 23/373* (2006.01)

(58) Field of Classification Search
CPC . H01L 2225/06562; H01L 2225/06517; H01L 2225/0651; H01L 25/0652; H01L 25/0657; H01L 23/3128; H01L 23/13; H01L 23/04; H01L 23/3736; H01L 23/3135

See application file for complete search history.

(56) References Cited

U.S. PATENT DOCUMENTS

| | | |
|---|---|---|
| 8,310,045 B2 | 11/2012 | Son |
| 8,564,108 B2 | 10/2013 | Fukuda et al. |
| 8,614,119 B2 | 12/2013 | Fukuda et al. |
| 8,614,505 B2 | 12/2013 | Fukuda et al. |
| 8,937,384 B2 | 1/2015 | Bao et al. |
| 8,994,168 B2 | 3/2015 | Sato |
| 9,368,425 B2 | 6/2016 | Graf et al. |
| 9,576,930 B2 | 2/2017 | Tseng et al. |
| 2013/0208426 A1 | 8/2013 | Kim et al. |
| 2015/0130045 A1* | 5/2015 | Tseng .................. H01L 23/3737 257/712 |
| 2017/0263589 A1* | 9/2017 | Chang Chien .......... H01L 25/50 |

FOREIGN PATENT DOCUMENTS

| | | |
|---|---|---|
| JP | 6008582 | 9/2016 |
| KR | 10-1069499 | 9/2011 |
| KR | 10-1111423 | 1/2012 |

\* cited by examiner

PACKAGED SEMICONDUCTOR DEVICES HAVING ENHANCED THERMAL TRANSPORT AND METHODS OF MANUFACTURING THE SAME

REFERENCE TO PRIORITY APPLICATION

This application claims priority under 35 U.S.C. § 119 to Korean Patent Application No. 10-2019-0124349, filed Oct. 8, 2019, the disclosure of which is hereby incorporated herein by reference.

BACKGROUND

1. Field

Example embodiments relate to packaged semiconductor devices and methods of fabricating packaged semiconductor devices and, more particularly, to system-in-package devices and methods of fabricating the same.

2. Description of the Related Art

In a memory-based system-in-package (SIP) device, a memory device may be adversely affected by heat from an adjacent logic device having a greater power demand. Thus, in such devices, it may be important to provide a heat transfer path for readily dissipating heat from the logic device to the surrounding environment, but without damaging the memory device. Although metal materials typically have many advantages for high capacity heat transfer, there are often restrictions on the use of metal as a heat transfer device within a package because of their high electrical conductivity.

In related arts, an adhesive member having a high thermal conductivity, such as a heat slug (a/k/a heat spreader), may be used for dissipating heat. Nonetheless, it may be difficult to use such adhesive members to efficiently dissipate heat from a logic device to a surrounding environment. Furthermore, an adhesive member including a metal material having high thermal conductivity may be limited in its use on a surface of a device because of its relatively high electrical conductivity.

SUMMARY

Example embodiments of the invention provide a packaged semiconductor device having improved heat dissipation performance and characteristics, and methods of manufacturing the same.

According to some example embodiments, a packaged semiconductor device includes a package substrate, a first semiconductor device arranged on the package substrate, and at least one second semiconductor device that extends on and at least partially covers the first semiconductor device. A heat dissipating insulation layer is provided as a coating on the first and second semiconductor devices. A conductive heat dissipation member is provided, which extends upwardly from the heat dissipating insulation layer and on the first and second semiconductor devices. A protective member is also provided, which extends on the package substrate and covers the first and second semiconductor devices and the conductive heat dissipation member. This protective member includes a first covering portion, which covers an upper surface of the conductive heat dissipation member.

According to further embodiments, a packaged semiconductor device is provided, which includes a package substrate, a first semiconductor device arranged on the package substrate, and at least one second semiconductor device, which extends on and at least partially covers the first semiconductor device. A heat dissipating insulation layer is provided as a coating on the first and second semiconductor devices. A first conductive heat dissipation member is provided, which is arranged on the heat dissipating insulation layer and on a portion of the first semiconductor device exposed by the second semiconductor device. A protective member is also provided on the package substrate, to cover the first and second semiconductor devices and the first conductive heat dissipation member. This protective member includes a first covering portion, which covers an upper surface of the first conductive heat dissipation member, and a second covering portion, which covers side surfaces of first and second semiconductor devices and the first covering portion.

According to additional embodiments, an electronic device is provided, which includes a substrate, a first electronic product arranged on the substrate, and at least one second electronic product, which extends on and at least partially covers the first electronic product. A heat dissipating insulation layer is also provided as a coating on the substrate and the first and second electronic products. A conductive heat dissipation member is provided, which extends upwardly from the heat dissipating insulation layer on the first and second electronic products. A protective member is provided on the substrate, to cover the first and second electronic products and the conductive heat dissipation member. This protective member includes a first covering portion, which covers an upper surface of the conductive heat dissipation member, and a second covering portion, which covers side surfaces of first and second electronic products and the first covering portion.

According to further embodiments, a method of manufacturing a packaged semiconductor device includes stacking a first semiconductor device on a package substrate. And, at least one second semiconductor device is stacked on the first semiconductor device to partially cover the first semiconductor device. A heat dissipating insulation layer is coated on the first and second semiconductor devices. A first conductive heat dissipation member is formed on the heat dissipating insulation layer, and on a portion of the first semiconductor device exposed by the second semiconductor device. A molding member is formed on the package substrate to cover the first and second semiconductor devices According to still further embodiments, a packaged semiconductor device may include first and second semiconductor devices sequentially stacked on a package substrate, a heat dissipating insulation layer coated on surfaces of the first and second semiconductor devices, and a conductive heat dissipation member extending upwardly on the heat dissipating insulation layer. A protective member is also provided on the package substrate. This protective member includes a first covering portion covering the conductive heat dissipation member. The conductive heat dissipation member may serve as an efficient heat transfer path for dissipating heat from the first and second semiconductor devices to a surrounding environment. Furthermore, the protective member having the first covering portion may cover the conductive heat dissipation member, to thereby prevent cracks from occurring in the conductive heat dissipation member during a subsequent manufacturing process, such as thermal cycle test process. Accordingly, heat from the first semiconductor device (consuming a relatively higher power) may be dissipated quickly in a vertical direction through the conductive heat dissipation member having high thermal conductivity. Thus, the heat dissipation performance of a system-in-package (SIP) may be improved.

BRIEF DESCRIPTION OF THE DRAWINGS

Example embodiments will be more clearly understood from the following detailed description taken in conjunction with the accompanying drawings, where

FIG. 1 is a cross-sectional view illustrating a packaged semiconductor device in accordance with example embodiments.

FIG. 2 is a plan view illustrating a portion of the packaged semiconductor device in FIG. 1.

FIGS. 3 to 7 are cross-sectional views illustrating a method of manufacturing a packaged semiconductor device in accordance with example embodiments.

FIG. 8 is a cross-sectional view illustrating a packaged semiconductor device in accordance with example embodiments.

FIGS. 9 and 10 are cross-sectional views illustrating a method of manufacturing a packaged semiconductor device in accordance with example embodiments.

FIG. 11 is a cross-sectional view illustrating a packaged semiconductor device in accordance with example embodiments.

FIG. 12 is a plan view illustrating the packaged semiconductor device in FIG. 11.

FIGS. 13 to 15 are cross-sectional views illustrating a method of manufacturing a packaged semiconductor device in accordance with example embodiments.

FIG. 16 is a cross-sectional view illustrating a packaged semiconductor device in accordance with example embodiments.

FIGS. 17 to 21 are cross-sectional views illustrating a method of manufacturing a packaged semiconductor device in accordance with example embodiments.

DETAILED DESCRIPTION OF EXAMPLE EMBODIMENTS

Hereinafter, example embodiments will be explained in detail with reference to the accompanying drawings.

Figure 1:
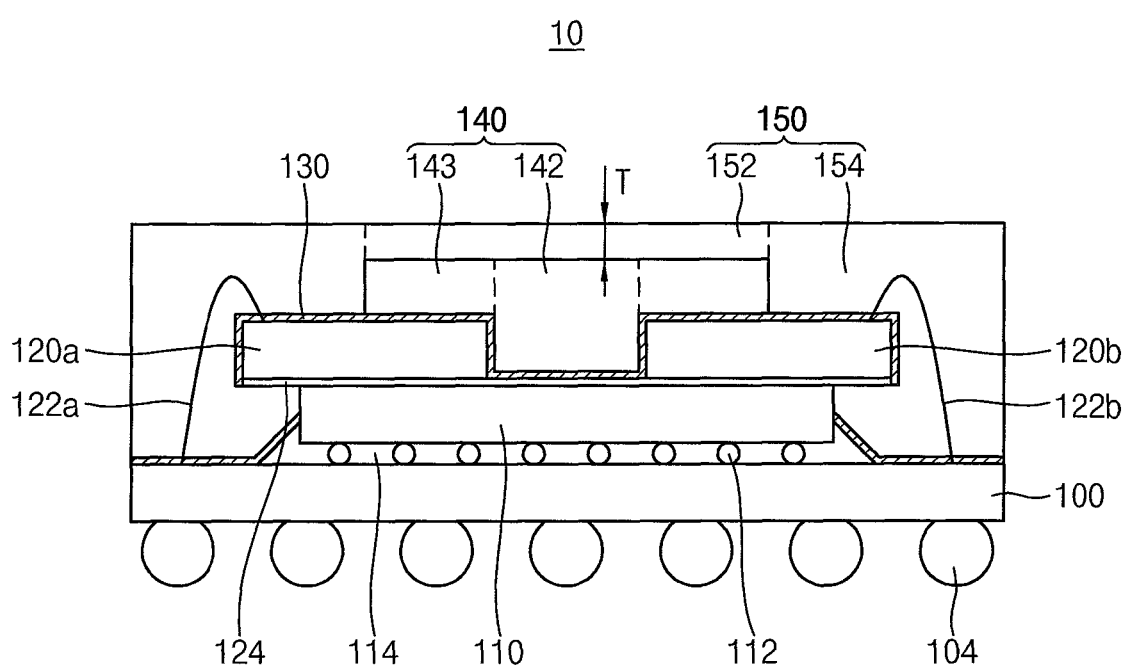
FIGS. 1 to 21 represent non-limiting, example embodiments as described herein.
Figure 2:
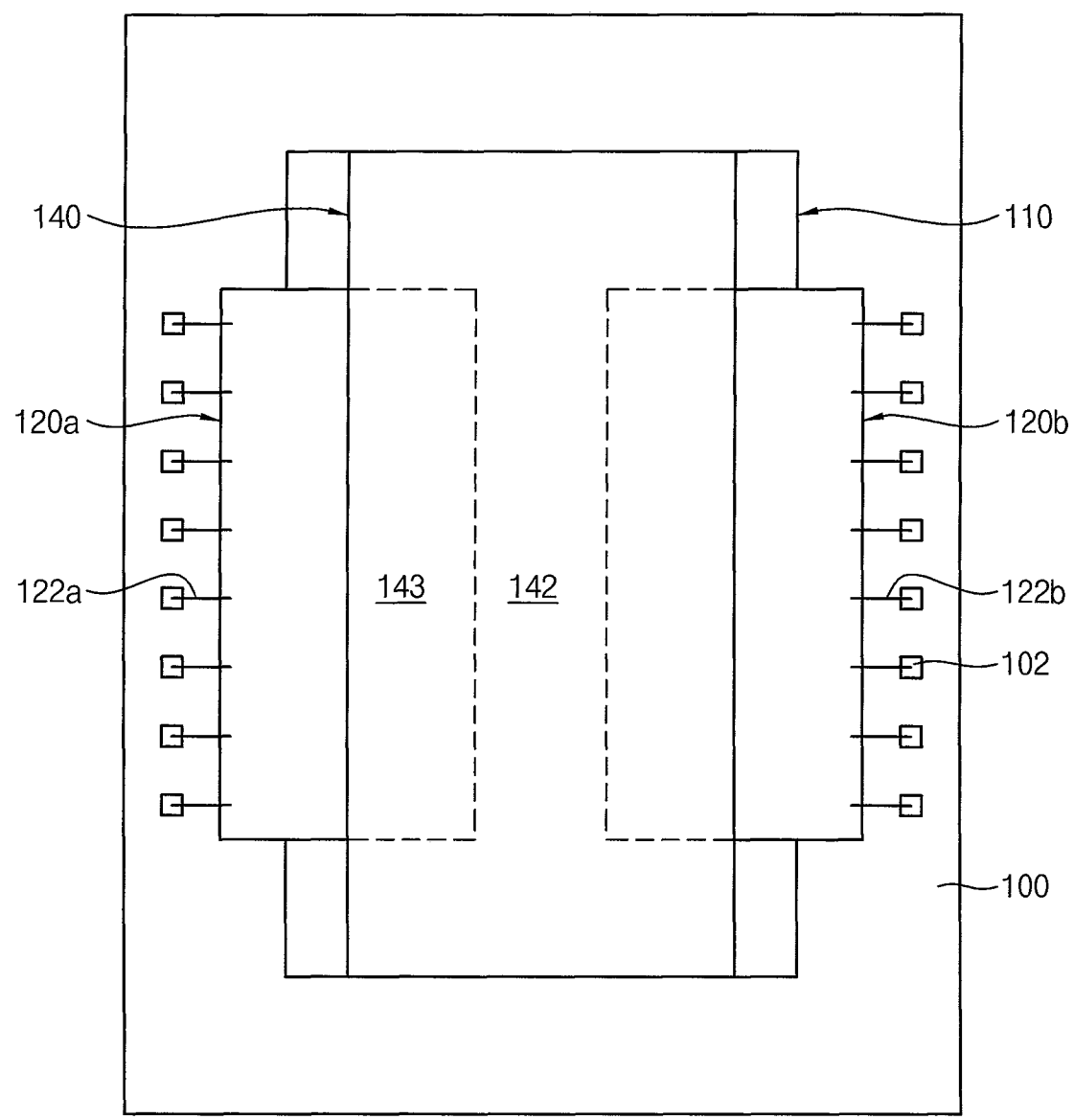

FIG. 1 is a cross-sectional view illustrating a packaged semiconductor device in accordance with example embodiments; and FIG. 2 is a plan view illustrating a portion of the packaged semiconductor device of FIG. 1, but with an omitted protective member. Referring to FIGS. 1 and 2, a packaged semiconductor device 10 may include a package substrate 100, a first semiconductor device 110, at least one second semiconductor device 120a, 120b, a heat dissipating electrically insulation layer 130, a conductive heat dissipation member 140, and a protective member 150.

In example embodiments, the packaged semiconductor device 10 may be an electronic device such as system-in-package (SIP). The first semiconductor device 110 may include a first electronic product such as a logic semiconductor device, and the at least one second semiconductor device 120a, 120b may include a second electronic product such as a memory device. The first electronic product may be a first heat source consuming a first power, and the second electronic product may be a second heat source consuming a second power lower than the first power. Accordingly, the first semiconductor device 110 may dissipate a greater amount of heat than the second semiconductor device(s) 120a, 120b.

The package substrate 100 may be a substrate having an upper surface and a lower surface opposite to each other. For example, the package substrate 100 may be a printed circuit board (PCB). The printed circuit board may include a multi-layer circuit board having vias and various circuit elements therein.

The first semiconductor device 110 may be stacked on the package substrate 100. The first semiconductor device 110 may be mounted on the package substrate 100 in a flip chip bonding manner. The first semiconductor device 110 may be electrically connected to the package substrate 100 via conductive bumps 112. A plurality of the conductive bumps 112 may be arranged on a plurality of substrate pads on the upper surface of the package substrate 100, to thereby electrically connect the first semiconductor device 110 and the package substrate 100 to each other. An adhesive member 114 may be underfilled between the first semiconductor device 110 and the package substrate 100. The adhesive member 114 may include an epoxy material filling between the first semiconductor device 110 and the package substrate 100.

Alternatively, the first semiconductor device 110 may be electrically connected to the package substrate 100 by bonding wires. In this case, the first semiconductor device 110 may be stacked on the package substrate 100 via an adhesive layer.

In example embodiments, the at least one second semiconductor device 120a, 120b may be stacked on the first semiconductor device 110 to partially cover the first semiconductor device 110. The second semiconductor device 120a, 120b may be overlapped partially with the first semiconductor device 110. A portion of an upper surface of the first semiconductor device 110 may be exposed by a gap extending between the second semiconductor device(s) 120a, 120b.

In particular, two second semiconductor devices 120a, 120b may be stacked on the first semiconductor device 110. The second semiconductor device(s) 120a, 120b may be arranged on the first semiconductor device 110 to be spaced apart from each other. The second semiconductor device(s) 120a, 120b may be stacked on the first semiconductor device 110 via an adhesive layer 124. The adhesive layer 124 may include a polymer material having excellent thermal conductivity. Examples of the polymer material may be a thermal conductive adhesive tape, a thermal conductive grease, a thermal conductive adhesive, etc. The second semiconductor device(s) 120a, 120b may be electrically connected to the package substrate 100 by bonding wires 122a, 122b.

For example, the second semiconductor device(s) 120a, 120b may include a non-volatile memory device such as DRAM, NAND flash memory, etc. The second semiconductor device may include a plurality of stacked semiconductor chips. The number, sizes, locations, etc. of the stacked chips are exemplarily illustrated, and thus, need not be limited thereto.

In example embodiments, the heat dissipating insulation layer 130 may be coated on the first and second semiconductor devices 110, 120a, 120b. The heat dissipating insulation layer 130 may be deposited conformally on the exposed entire surfaces of the package substrate 100 and the first and second semiconductor devices 110, 120a, 120b. Accordingly, the upper surface of the package substrate 100, a sidewall of the first semiconductor device 110, and upper surfaces and sidewalls of the second semiconductor device(s) 120a, 120b may be covered by the heat dissipating insulation layer 130. The heat dissipating insulation layer 130 may include an electrically insulating material having excellent thermal conductivity. The heat dissipating insulation layer 130 may include silica (SiO2), aluminum oxide ($Al_2O_3$), boron nitride (BN), aluminum nitride (AlN), ceramics coated metal balls, etc.

In example embodiments, the conductive heat dissipation member 140 may include a first conductive heat dissipation member 142 disposed on a portion of the heat dissipating insulation layer 130 on the first semiconductor device 110, which is exposed by the second semiconductor device 120a, 210b. Additionally, the conductive heat dissipation member 140 may further include a second conductive heat dissipation member 143 disposed on the heat dissipating insulation layer 130 and on the second semiconductor device 120a, 120b. Accordingly, as shown, the conductive heat dissipation member 140 may be arranged on the heat dissipating insulation layer 130 on the first semiconductor device 110 exposed by the second semiconductor device 120a, 120b and on the heat dissipating insulation layer 130 on the second semiconductor device 120a, 120b. The conductive heat dissipation member 140 may include a conductive material having excellent thermal conductivity such as a metal such as gold (Au), silver (Ag), copper (Cu), etc, graphite, graphene, etc.

The first conductive heat dissipation member 142 may have a pillar shape extending in a vertical direction from the surface of the heat dissipating insulation layer 130, in the gap between the second semiconductor device(s) 120a, 120b. The first conductive heat dissipation member 142 may make contact with the heat dissipating insulation layer 130 on the sidewalls of the second semiconductor device(s) 120a, 120b. Alternatively, the first conductive heat dissipation member 142 may be arranged to be spaced apart from the heat dissipating insulation layer 130 on the sidewalls of the second semiconductor device(s) 120a, 120b.

The second conductive heat dissipation member 143 may extend laterally on the heat dissipating insulation layer 130 on the second semiconductor device(s) 120a, 120b. The second conductive heat dissipation member 143 may make contact with the first conductive heat dissipation member 142, as shown. Alternatively, the second conductive heat dissipation member 143 may be arranged to be spaced apart from a sidewall of the first conductive heat dissipation member 142.

The second conductive heat dissipation member 143 may be formed integrally with the first conductive heat dissipation member 142. The second conductive heat dissipation member 143 may have a height the same as a height of the first conductive heat dissipation member 142 from the package substrate 100.

In example embodiments, the protective member 150 may be formed as a passivation layer on the package substrate 100 to cover at least a portion of the first and second semiconductor devices 110, 120a, 120b, to thereby protect the first and second semiconductor devices 110, 120a, 120b from the surrounding environment. The protective member 150 may include a first covering portion 152 covering at least a portion of the upper surface of the conductive heat dissipation member 140 and a second covering portion 154 covering the first and second semiconductor devices 110, 120a, 120b.

The first covering portion 152 may make contact with the upper surface of the conductive heat dissipation member 140. The first covering portion 152 may be provided to cover the upper surface of the conductive heat dissipation member 140, and the second covering portion 154 may be provided to cover a side surface of the first covering portion 152.

For example, the first covering portion 152 may have a thickness T of about 30 μm about 150 μm. When the thickness T of the first covering portion 152 is less than 30 μm, crack in the conductive heat dissipation member 140 may occur easily by external impacts. When the thickness T of the first covering portion 152 is greater than 150 μm, heat transfer through the conductive heat dissipation member 140 may be restricted, thereby reducing heat dissipation performance.

The protective member 150 may include the first covering portion 152 and the second covering portion 154 formed integrally with each other. In this case, the first and second covering portions 152, 154 may include a molding material such as epoxy molding compound (EMC).

As mentioned above, the packaged semiconductor device 10 may include the first conductive heat dissipation member 142 thermally connected to the first semiconductor device 110 to dissipate heat from the first semiconductor device 110 to the surrounding environment. The packaged semiconductor device 10 may include the second conductive heat dissipation member 143 thermally connected to the second semiconductor device 120a, 120b to dissipate heat from the second semiconductor device 120a, 120b to the surrounding environment. The packaged semiconductor device 10 may include the protective member 150 having the first covering portion 152 covering the upper surface of the first and second conductive heat dissipation member 142, 143.

The heat from the first semiconductor device 110 may be dissipated through the heat dissipating insulation layer 130 and the first conductive heat dissipation member 142. The heat from the second semiconductor device 120a, 120b may be dissipated through the heat dissipating insulation layer 130 and the second conductive heat dissipation member 143. The first and second conductive heat dissipation members 142, 143 may serve as a heat transfer path for dissipating heat from the first and second semiconductor devices 110, 120a, 120b to the surrounding environment. Further, the protective member 150 having the first covering portion 152 may cover the conductive heat dissipation member 140 to prevent crack from occurring in the conductive heat dissipation member 140 during a following process such as thermal cycle test process.

Accordingly, the heat from the first semiconductor device 110 consuming a relatively higher power may be dissipated quickly in the vertical direction through the first conductive heat dissipation member 142 having high thermal conductivity. Thus, heat dissipation performance and reliability of the system-in-package may be improved.

Figure 3:
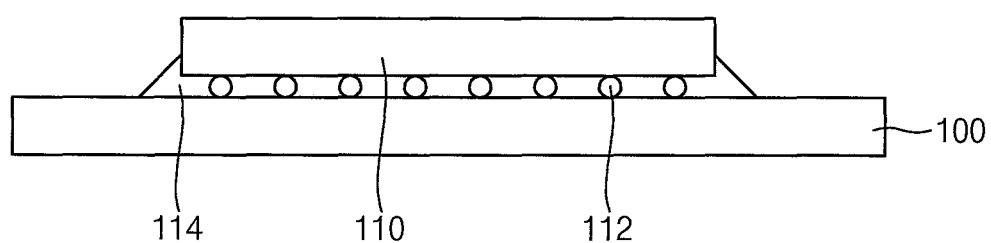
Figure 4:
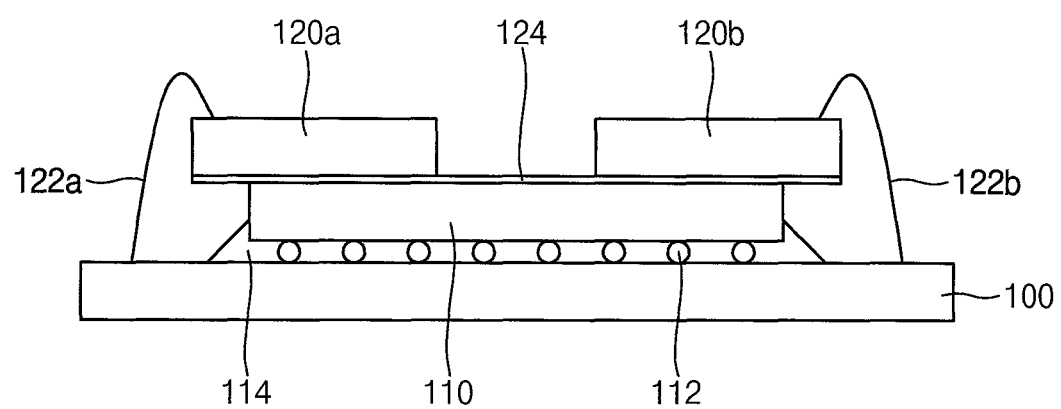

Referring now to FIGS. 3 through 7, an embodiment of a method of manufacturing the packaged semiconductor device of FIGS. 1 and 2 will be explained. As shown by FIGS. 3-4, a first semiconductor device 110 may be stacked on a package substrate 100, and at least one second semiconductor device 120a, 120b may be stacked on the first semiconductor device 110 to partially cover the first semiconductor device 110.

First, the first semiconductor device 110 may be stacked on an upper surface of the package substrate 100. For example, the package substrate 100 may include a printed circuit board (PCB), an organic substrate, a ceramic substrate, a module board, etc.

The first semiconductor device 110 may be stacked on the package substrate 100. The first semiconductor device 110 may be mounted on the package substrate 100 in a flip chip bonding manner. The first semiconductor device 110 may be electrically connected to the package substrate 100 via conductive bumps 112. A plurality of the conductive bumps 112 may be arranged on a plurality of substrate pads on the upper surface of the package substrate 100 to electrically connect the first semiconductor device 110 and the package substrate 100 to each other.

After the first semiconductor device 110 is adhered on the package substrate 100, an adhesive member 114 may be underfilled between the first semiconductor device 110 and the package substrate 100. The adhesive member 114 may include an epoxy material filling between the first semiconductor device 110 and the package substrate 100.

Then, two second semiconductor devices 120a, 120b may be stacked on the first semiconductor device 110 to partially cover the first semiconductor device 110. The second semiconductor device(s) 120a, 120b may be overlapped partially with the first semiconductor device 110. A portion of an upper surface of the first semiconductor device 110 may be exposed by the second semiconductor device(s) 120a, 120b.

The second semiconductor device(s) 120a, 120b may be arranged on the first semiconductor device 110 to be spaced apart from each other. The second semiconductor device(s) 120a, 120b may be stacked on the first semiconductor device 110 via an adhesive layer 124. The adhesive layer 124 may include a polymer material having excellent thermal conductivity. Examples of the polymer material may be a thermal conductive adhesive tape, a thermal conductive grease, a thermal conductive adhesive, etc.

A wire bonding process may be performed to electrically connect chip pads of the second semiconductor device(s) 120a, 120b to the substrate pads of the package substrate 100. The chip pads of the second semiconductor device(s) 120a, 120b may be electrically connected to the substrate pads of the package substrate 100 by bonding wires 122a, 122b.

Figure 5:
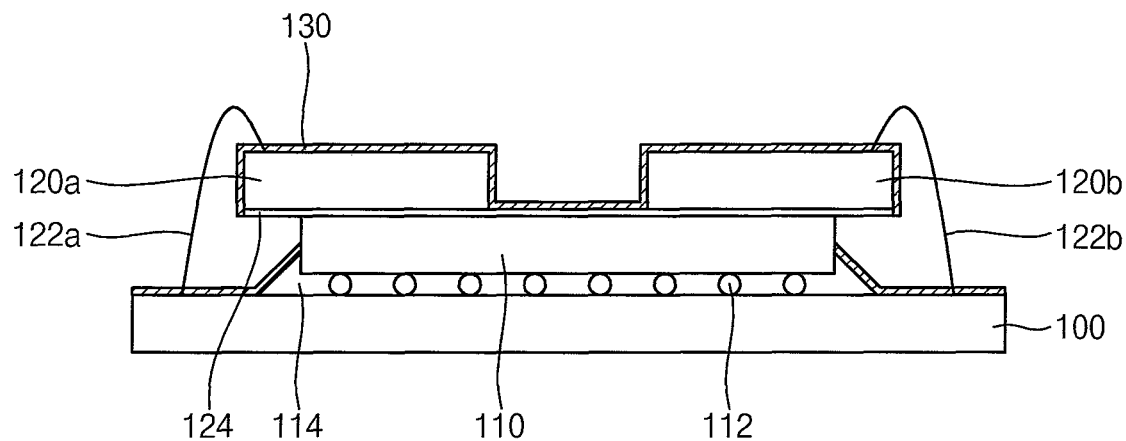
Figure 6:
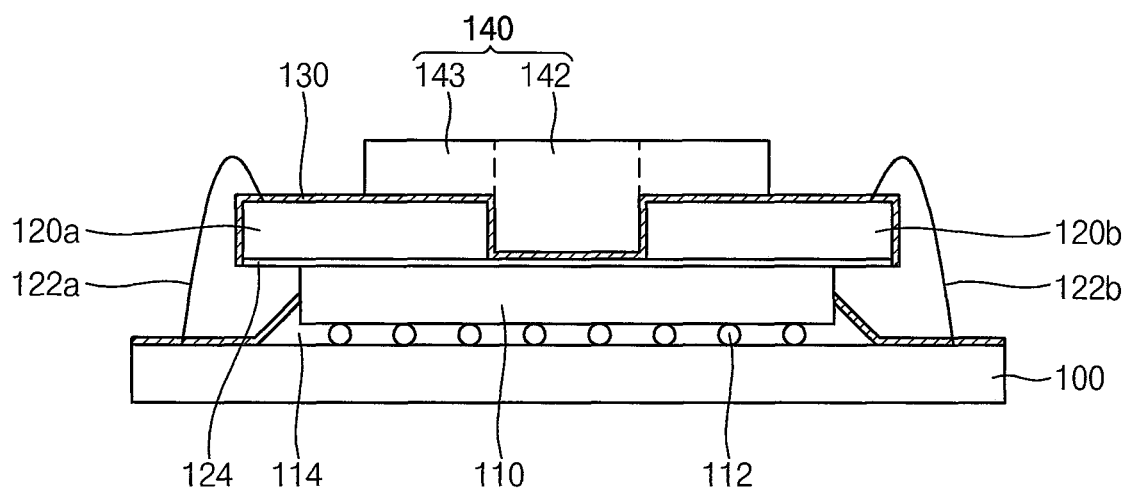

Referring to FIGS. 5 and 6, a heat dissipating insulation layer 130 may be coated on the first and second semiconductor devices 110, 120a, 120b, and a first conductive heat dissipation member 142 may be formed on the heat dissipating insulation layer 130 over the first semiconductor device 110 exposed by the second semiconductor device 120a, 210b. A second conductive heat dissipation member 143 may be formed on the heat dissipating insulation layer 130 over the second semiconductor device 120a, 120b.

In example embodiments, the heat dissipating insulation layer 130 may be coated conformally on the exposed entire surfaces of the package substrate 100 and the first and second semiconductor devices 110, 120a, 120b by a spray coating process. An insulation material may be sprayed out on the exposed entire surfaces of the package substrate 100 and the first and second semiconductor devices 110, 120a, 120b using a spray nozzle to form the heat dissipating insulation layer 130 having a uniform thickness. The insulation material may have excellent thermal conductivity. The heat dissipating insulation layer 130 may include silica ($SiO_2$), aluminum oxide ($Al_2O_3$), boron nitride (BN), aluminum nitride (AlN), ceramics coated metal balls, etc.

Then, the first conductive heat dissipation member 142 may be formed by a dispensing process, a screen printing process, etc. For example, a metal paste may be dispensed on the heat dissipating insulation layer 130 over the first semiconductor device 110 exposed by the second semiconductor device 120a, 120b to form the first conductive heat dissipation member 142. In the dispensing process, the metal paste may be dispensed on the heat dissipating insulation layer 130 over the second semiconductor device(s) 120a, 120b to form the second conductive heat dissipation member 143.

The metal paste may be dispensed repeatedly using a dispenser to form the first and second conductive heat dissipation members 142, 143 having a desired shape to desired location. The metal paste may include a conductive material having excellent thermal conductivity such as a metal such as gold (Au), silver (Ag), copper (Cu), etc.

The first conductive heat dissipation member 142 may be formed to have a pillar shape extending in a vertical direction from the surface of the heat dissipating insulation layer 130 between the second semiconductor device(s) 120a, 120b. The first conductive heat dissipation member 142 may make contact with the heat dissipating insulation layer 130 on sidewalls of the second semiconductor device(s) 120a, 120b. Alternatively, the first conductive heat dissipation member 142 may be arranged to be spaced apart from the heat dissipating insulation layer 130 on the sidewalls of the second semiconductor device(s) 120a, 120b.

The second conductive heat dissipation member 143 may be formed to extend laterally on the heat dissipating insulation layer 130 on the second semiconductor device(s) 120a, 120b. The second conductive heat dissipation member 143 may make contact with the first conductive heat dissipation member 142. Alternatively, the second conductive heat dissipation member 143 may be arranged to be spaced apart from a sidewall of the first conductive heat dissipation member 142.

The second conductive heat dissipation member 143 may be formed integrally with the first conductive heat dissipation member 142. The second conductive heat dissipation member 143 may have a height the same as a height of the first conductive heat dissipation member 142 from the package substrate 100.

Figure 7:
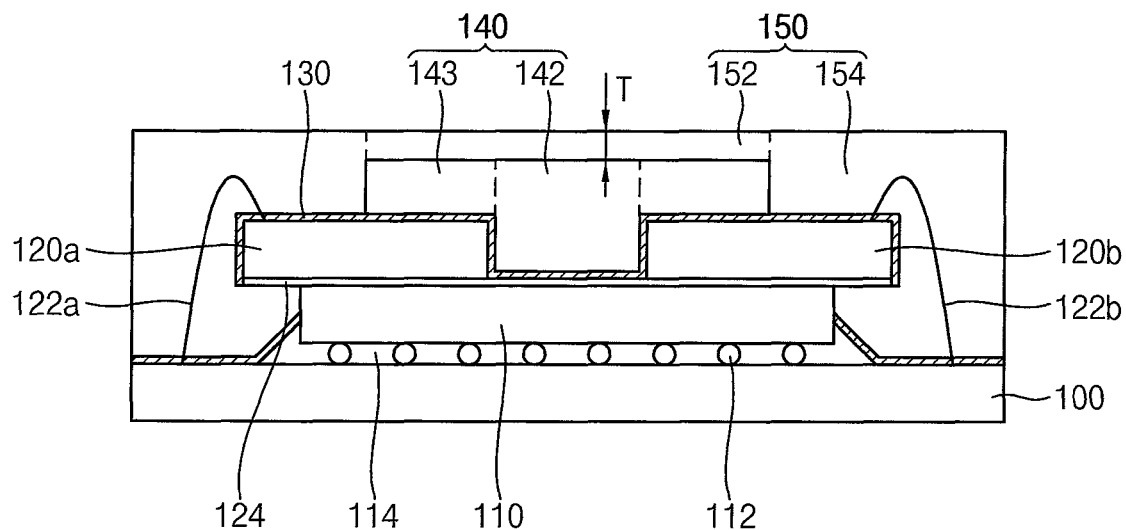

Referring to FIG. 7, a protective member 150 may be formed on the package substrate 100 to cover the first and second semiconductor devices 110, 120a, 120b and the first and second conductive heat dissipation members 142, 143. The protective member 150 may include a first covering portion 152 covering upper surfaces of the first and second conductive heat dissipation member 140 and a second covering portion 154 covering the first and second semiconductor devices 110, 120a, 120b.

The first covering portion 152 may make contact with the upper surfaces of the first and second conductive heat dissipation members 142, 143. The first covering portion 152 may be formed to cover the upper surfaces of the first and second conductive heat dissipation members 142, 143, and the second covering portion 154 may be formed to cover a side surface of the first covering portion 152.

For example, an insulation material such as epoxy molding compound (EMC) may be coated on the upper surface of the package substrate 100 to form the protective member 150. Then, outer connection members 104 may be formed on outer connection pads on a lower surface of the package substrate 100 to complete the packaged semiconductor device 10 in FIG. 1.

Figure 8:
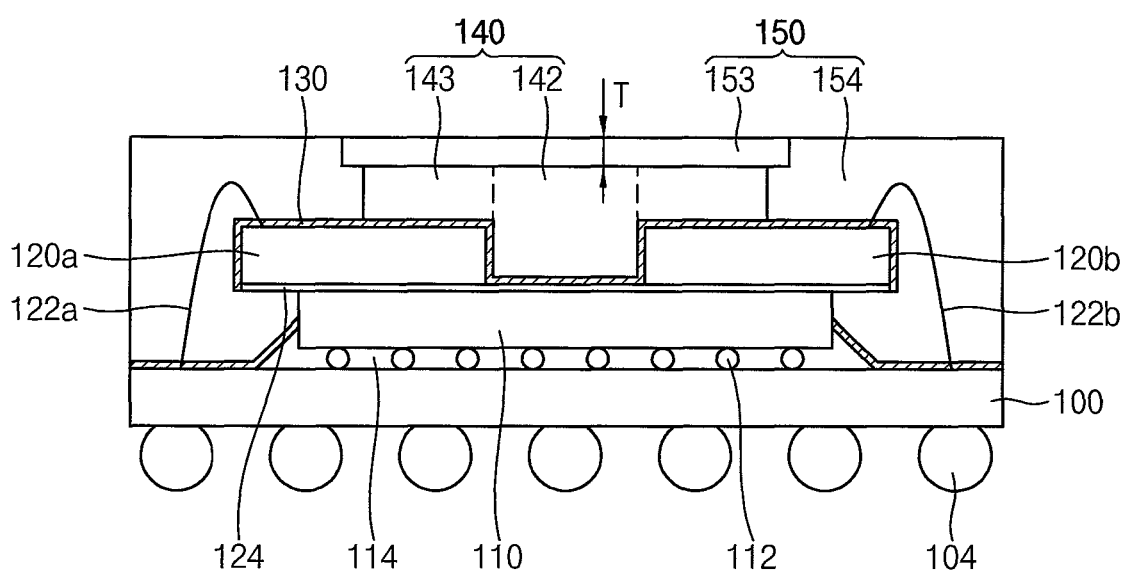

FIG. 8 is a cross-sectional view illustrating a packaged semiconductor device in accordance with example embodiments. The packaged semiconductor device may be substantially the same as or similar to the packaged semiconductor device described with reference to FIG. 1 except for a protective member. Thus, same reference numerals will be used to refer to the same or like elements and any further repetitive explanation concerning the above elements will be omitted.

Referring to FIG. 8, a protective member 150 of a packaged semiconductor device 11 may include a first covering portion 153 covering an upper surface of a conductive heat dissipation member 140 and a second covering portion 154 covering first and second semiconductor devices 110, 120a, 120b.

In example embodiments, the first covering portion 153 may include a protective plate which makes contact with the upper surface of the conductive heat dissipation member 140. The protective plate may have a thickness T of about 30 µm to about 150 µm. The protective plate may include a metal or polymer material having excellent thermal conductivity. The second covering portion 154 may include a molding material such as epoxy molding compound (EMC).

The first covering portion 153 may have a first thermal conductivity, and the second covering portion 154 may have a second thermal conductivity greater than the first thermal conductivity. Because the first covering portion 153 includes the metal plate having relatively high thermal conductivity, thermal resistance in a heat transfer path for dissipating heat through the conductive heat dissipation member 140 may be minimized.

Figure 9:
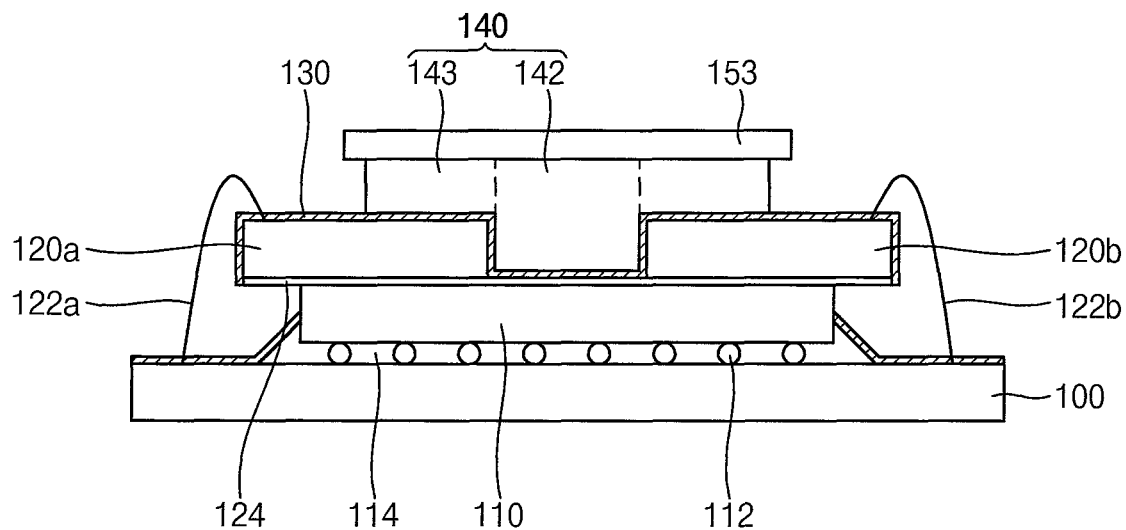

Hereinafter, a method of manufacturing the packaged semiconductor device of FIG. 8 according to an exemplary embodiment will be explained with respect to FIGS. 9-10. Referring to FIG. 9, first, processes the same as processes as described with reference to FIGS. 3 to 5 may be performed such that a heat dissipating insulation layer 130 is coated on first and second semiconductor devices 110, 120a, 120b on a package substrate 100. Then, a conductive heat dissipation member 140 may be formed to extend upwardly from the heat dissipating insulation layer 130 on the first and second semiconductor devices 110, 120a, 120b, and a first covering portion 153 may be formed on the conductive heat dissipation member 140.

In particular, after a metal paste is dispensed on the heat dissipating insulation layer 130 over the first semiconductor device 110 exposed by the second semiconductor device 120a, 120b and the heat dissipating insulation layer 130 over the second semiconductor device(s) 120a, 120b, a protective plate 153 as the first covering portion may be pressed on the metal paste, and then, the metal paste may be cured. Thus, the protective plate 153 may be formed on the conductive heat dissipation member 140 having first and second conducive heat dissipation members 142, 143.

The metal paste may be dispensed repeatedly using a dispenser to form the first and second conductive heat dissipation members 142, 143 having a desired shape to desired location. The metal paste may include a conductive material having excellent thermal conductivity such as a metal such as gold (Au), silver (Ag), copper (Cu), etc.

The protective plate 153 may be formed directly on the conductive heat dissipation member 140 without an additional adhesive layer. The protective plate may have a thickness T of about 30 µm to about 150 µm. The protective plate may include a metal or polymer material having excellent thermal conductivity.

Figure 10:
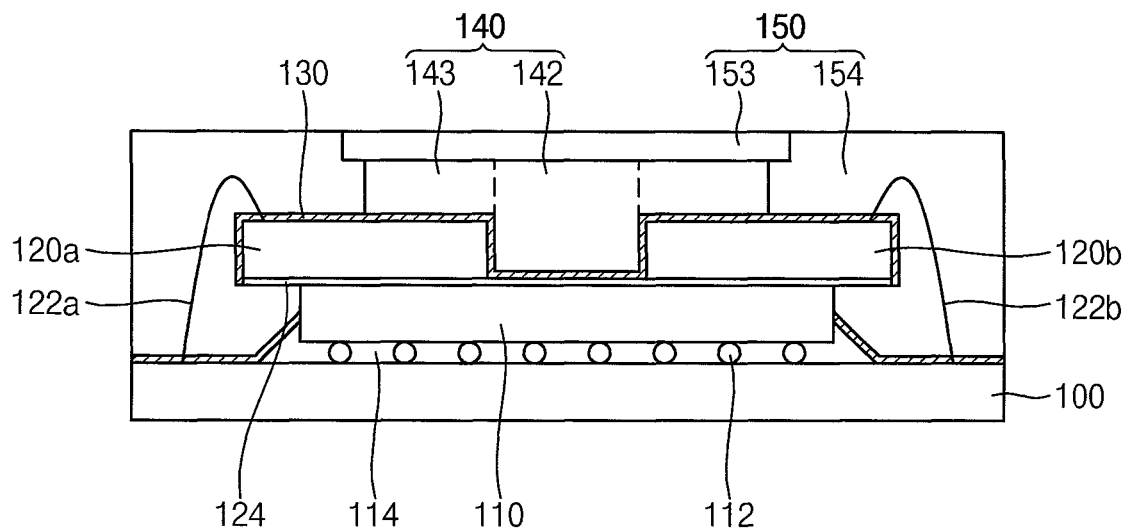

Referring to FIG. 10, a second covering portion 154 may be formed on an upper surface of the package substrate 100 to cover the first and second semiconductor devices 110, 120a, 120b and the first covering portion 153. The second covering portion 154 may be formed to expose an upper surface of the first covering portion 153. Thus, a protective member 150 including the first and second covering portions 153, 154 may be formed. The protective member 150 may cover the first and second semiconductor devices 110, 120a, 120b and the conductive heat dissipation member 140.

An insulation material such as epoxy molding compound (EMC) may be coated on the upper surface of the package substrate 100, and the coated insulation material may be ground to expose the upper surface of the first covering portion 153. The second covering portion 154 may have a height the same as a height of the first covering portion 153 from the package substrate 100. Then, outer connection members 104 may be formed on outer connection pads on a lower surface of the package substrate 100 to complete the packaged semiconductor device 11 in FIG. 8.

Figure 11:
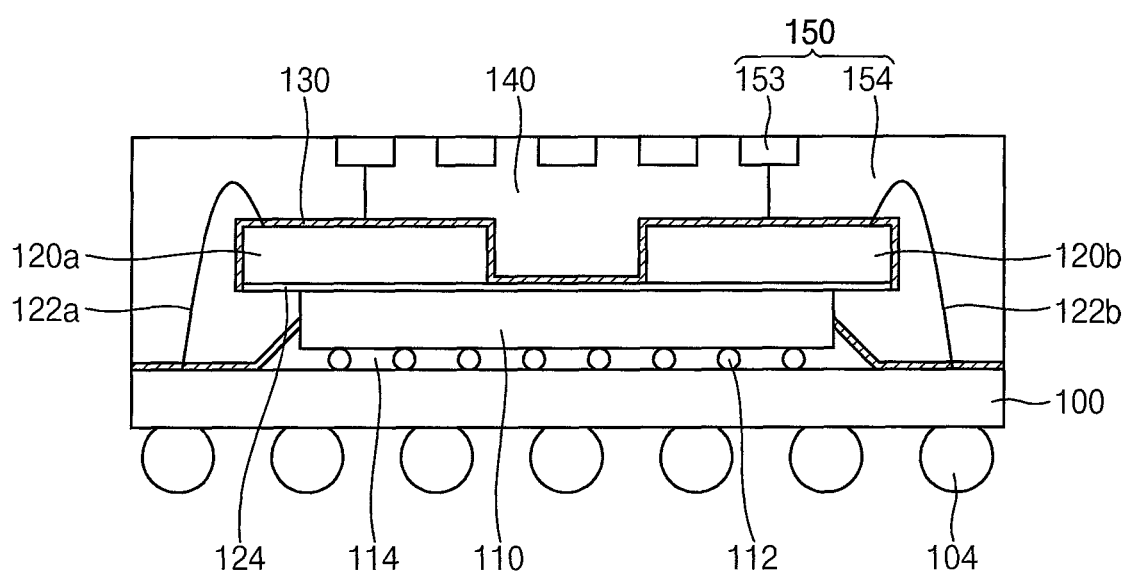
Figure 12:
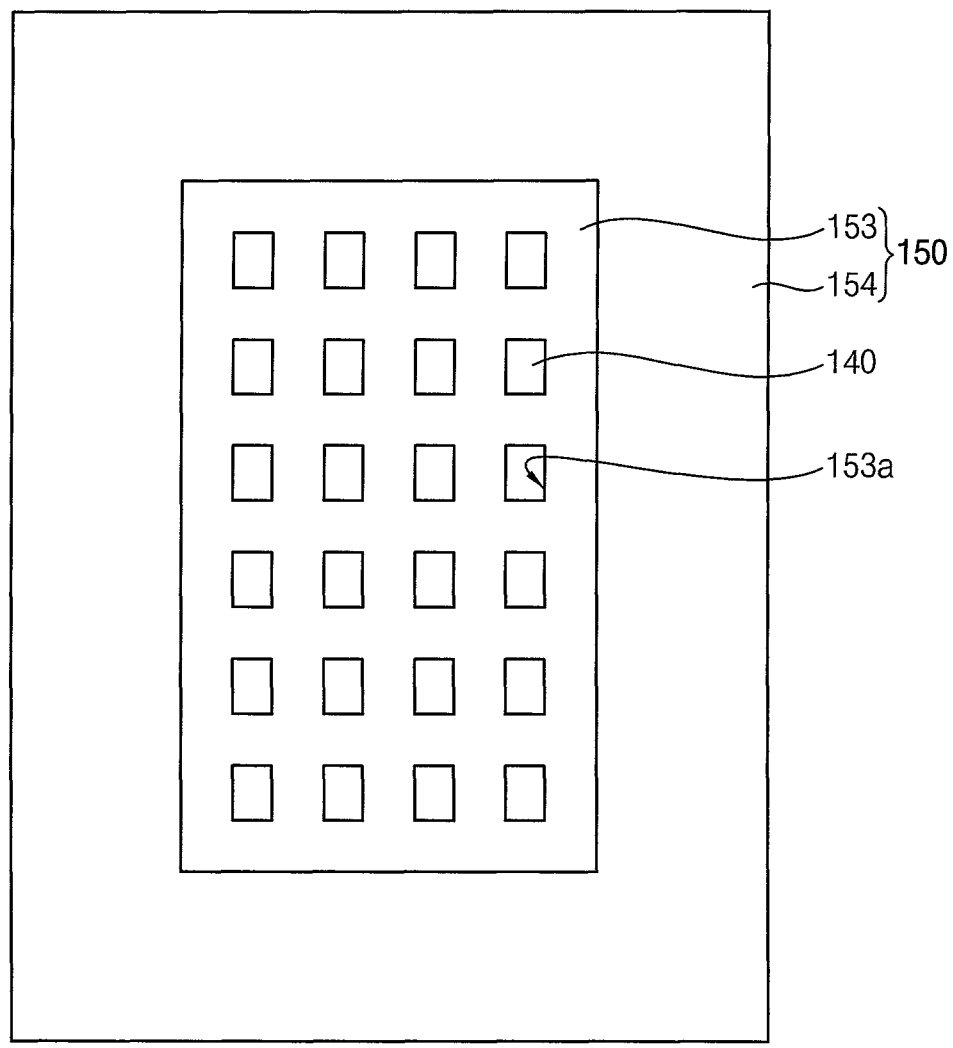

FIG. 11 is a cross-sectional view illustrating a packaged semiconductor device in accordance with example embodiments. FIG. 12 is a plan view illustrating the packaged semiconductor device in FIG. 11. The packaged semiconductor device may be substantially the same as or similar to the packaged semiconductor device described with reference to FIG. 1 except for a first covering portion. Thus, same reference numerals will be used to refer to the same or like elements and any further repetitive explanation concerning the above elements will be omitted.

Referring to FIGS. 11 and 12, a protective member 150 of a packaged semiconductor device 12 may include a first covering portion 153 covering at least a portion of an upper surface of a conductive heat dissipation member 140 and a second covering portion 154 covering first and second semiconductor devices 110, 120a, 120b.

In example embodiments, the first covering portion 153 may include a protective plate which covers at least a portion of the conductive heat dissipation member 140. The first covering portion 153 may have a plurality of through holes 153a therein. The conductive heat dissipation member 140 may have a plurality of protrusions extending upwardly through the through holes 153a. An upper surface of the protrusion may be coplanar with an upper surface of the first covering portion 153.

For example, the through hole may have a square pillar shape or a cylinder shape. A shape or size of the through hole, the number of the through holes, etc. may not be limited thereto.

The first covering portion 153 may partially cover the upper surface of the conductive heat dissipation member 140 and the protrusions may be inserted into the through holes 153a of the first covering portion 153, so that a crack may be prevented from occurring in the conductive heat dissipation member 140, and heat dissipation performance in a vertical direction through the conductive heat dissipation member 140 may be improved.

Figure 13:
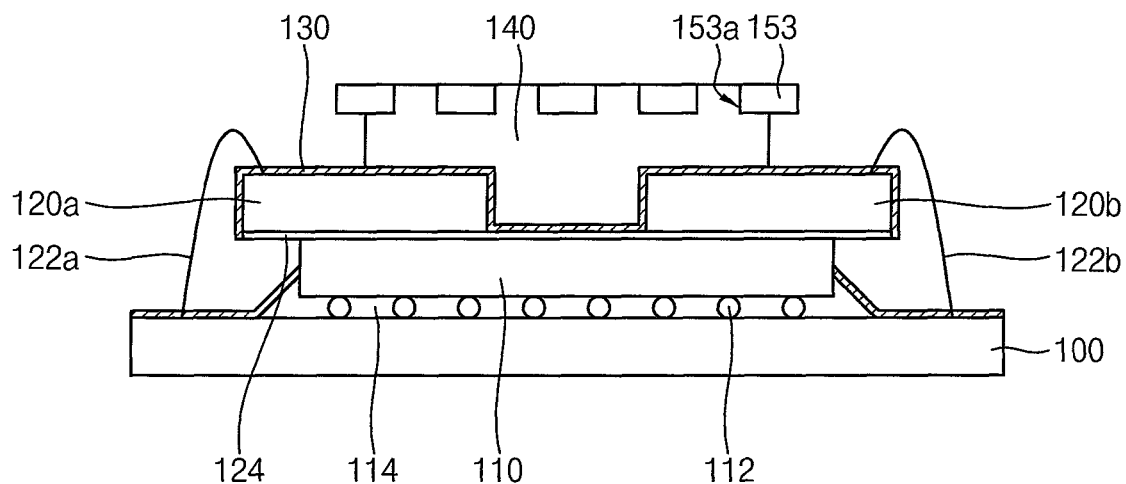
Figure 14:
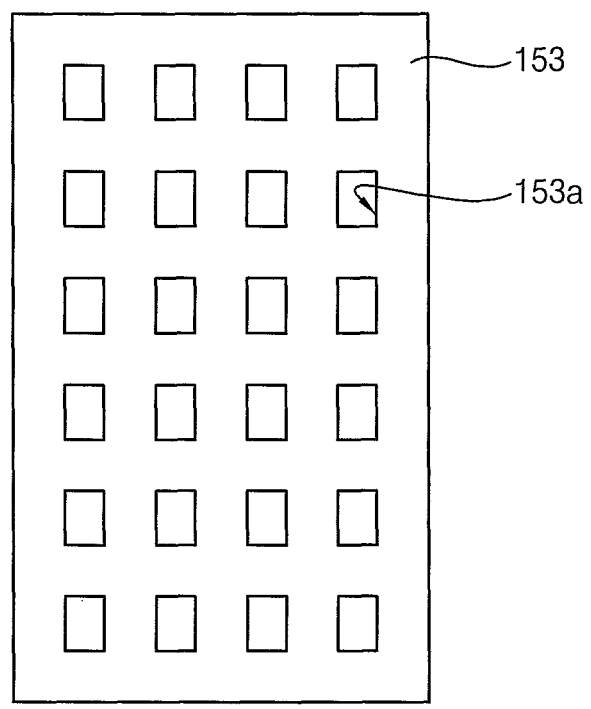
Figure 15:
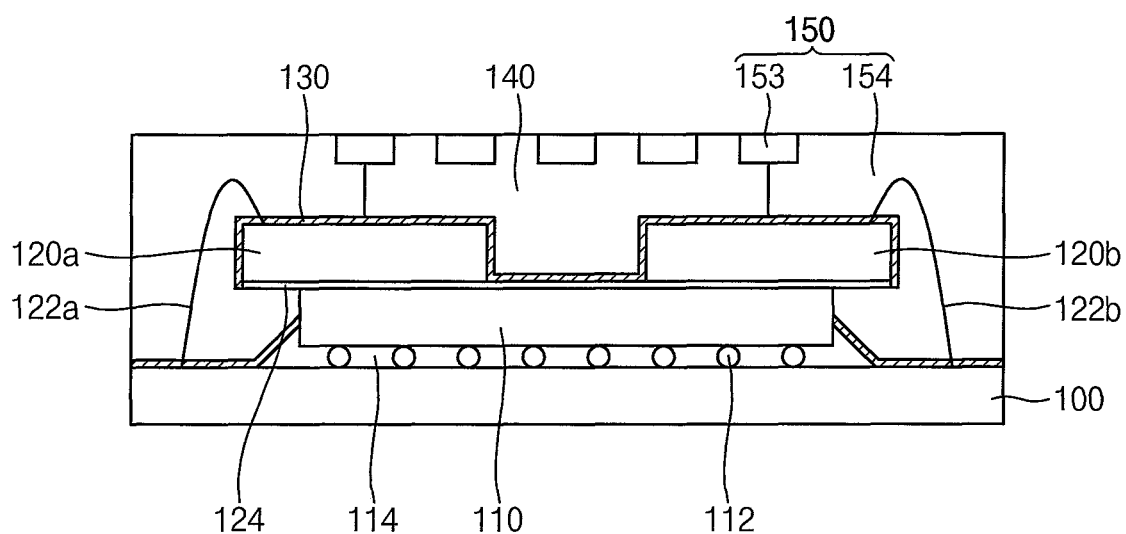

Hereinafter, a method of manufacturing the packaged semiconductor device of FIGS. 11-12 will be described with respect to FIGS. 13 to 15. In particular, FIGS. 13 to 15 are cross-sectional views illustrating a method of manufacturing a packaged semiconductor device in accordance with example embodiments. FIG. 14 is a plan view illustrating a first covering portion in FIG. 13. Referring to FIGS. 13 and 14, first, processes the same as processes as described with reference to FIGS. 3 to 5 may be performed such that a heat dissipating insulation layer 130 is coated on first and second semiconductor devices 110, 120a, 120b on a package substrate 100. Then, a conductive heat dissipation member 140 may be formed to extend from the heat dissipating insulation layer 130 on the first and second semiconductor devices 110, 120a, 120b, and a first covering portion 153 may be formed on the conductive heat dissipation member 140.

In particular, after a metal paste is dispensed on the heat dissipating insulation layer 130 over the first semiconductor device 110 exposed by the second semiconductor device(s) 120a, 120b and the heat dissipating insulation layer 130 over the second semiconductor device(s) 120a, 120b, a protective plate 153 as the first covering portion may be pressed on the metal paste, and then, the metal paste may be cured.

Thus, the protective plate 153 may be formed on the conductive heat dissipation member 140 to partially cover the conductive heat dissipation member 140.

The first covering portion 153 as the first covering portion may have a plurality of through holes 153a therein. When the metal paste is dispensed repeatedly using a dispenser and the protective plate 153 is pressed, a portion of the metal paste may be inserted into the through holes 153a of the first covering portion 153. Then, as the metal paste is cured, the conductive heat dissipation member 140 may be formed to have protrusions extending upwardly through the through holes 153a of the first covering portion 153.

Referring to FIG. 15, a second covering portion 154 may be formed on an upper surface of the package substrate 100 to cover the first and second semiconductor devices 110, 120a, 120b and the first covering portion 153. The second covering portion 154 may be formed to expose an upper surface of the first covering portion 153. Thus, a protective member 150 including the first and second covering portions 153, 154 may be formed. The protective member 150 may cover the first and second semiconductor devices 110, 120a, 120b and the conductive heat dissipation member 140 on the upper surface of the package substrate 100.

An insulation material such as epoxy molding compound may be coated on the upper surface of the package substrate 100, and the coated insulation material may undergo a grinding process to expose the upper surface of the first covering portion 153. The second covering portion 154 may have a height the same as a height of the first covering portion 153 from the package substrate 100.

Then, outer connection members 104 may be formed on outer connection pads on a lower surface of the package substrate 100 to complete the packaged semiconductor device 12 in FIG. 11.

Figure 16:
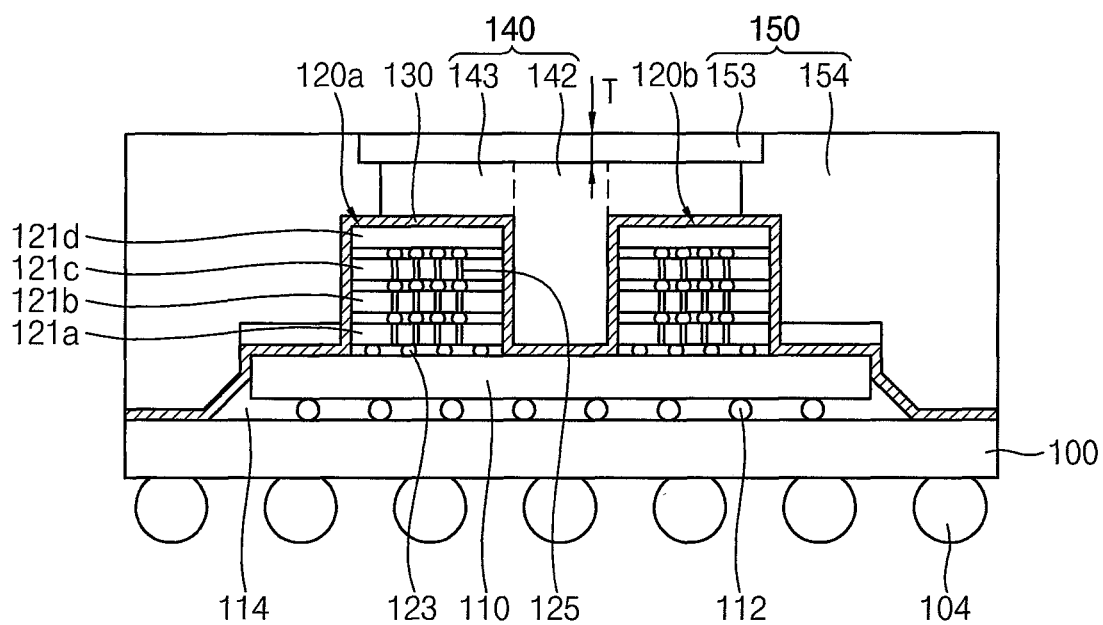

FIG. 16 is a cross-sectional view illustrating a packaged semiconductor device in accordance with example embodiments. The packaged semiconductor device may be substantially the same as or similar to the packaged semiconductor device described with reference to FIG. 8 except for a second semiconductor device(s). Thus, the same reference numerals will be used to refer to the same or like elements and any further repetitive explanation concerning the above elements will be omitted.

Referring to FIG. 16, a second semiconductor device(s) 120a, 120b of a packaged semiconductor device 13 may include a plurality of stacked semiconductor chips. The second semiconductor device(s) 120a, 120b may include a high bandwidth memory (HBM) device. In example embodiments, two second semiconductor devices 120a, 120b may be arranged on a first semiconductor device 110 to be spaced apart from each other. The second semiconductor device(s) 120a, 120b may include a buffer die 121a and first to third memory dies 121b, 121c, 121d sequentially stacked on one another. The buffer die 121a and the first to third memory dies 121b, 121c, 121d may be electrically connected to each other by TSVs (through silicon vias) 125. The buffer die 121a and the first to third memory dies 121b, 121c, 121d may communicate date signals and control signals with each other through the TSVs 125. The buffer die 121a may be electrically connected to the first semiconductor device 110 by a plurality of conductive bumps 123. The second semiconductor device(s), as the HBM device, including four stacked dies (chips) is exemplarily illustrated, however, it may not be limited thereto.

A heat dissipating insulation layer 130 may be coated conformally on the entire exposed surfaces of a package substrate 100 and the first and second semiconductor devices 110, 120a, 120b. Accordingly, the heat dissipating insulation layer 130 may be coated on an upper surface of the package substrate 100, a sidewall of the first semiconductor device 110, and upper surface and sidewalls of the second semiconductor device(s) 120a, 120b, as shown.

In example embodiments, a conductive heat dissipation member 140 may include a first conductive heat dissipation member 142 disposed on the heat dissipating insulation layer 130 on the first semiconductor device 110 exposed by the second semiconductor device 120a, 120b. Additionally, the conductive heat dissipation member 140 may further include a second conductive heat dissipation member 143 disposed on the heat dissipating insulation layer 130 over the second semiconductor device(s) 120a, 120b. Accordingly, the conductive heat dissipation member 140 may be may be arranged on the heat dissipating insulation layer 130 on the first semiconductor device 110 exposed by the second semiconductor device(s) 120a, 120b, and also on the heat dissipating insulation layer 130 on the second semiconductor device(s) 120a, 120b.

In example embodiments, a protective member 150 may include a first covering portion 153 covering an upper surface of the conductive heat dissipation member 140 and a second covering portion 154 covering the first and second semiconductor devices 110, 120a, 120b.

In example embodiments, the first covering portion 153 may include a protective plate which makes contact with the upper surface of the conductive heat dissipation member 140. The protective plate may have a thickness T of about 30 μm to about 150 μm. The protective plate may include a metal or polymer material having excellent thermal conductivity. The second covering portion 154 may include a molding material such as epoxy molding compound (EMC).

The first covering portion 153 may have a first thermal conductivity, and the second covering portion 154 may have a second thermal conductivity greater than the first thermal conductivity. Because the first covering portion 153 includes a metal plate having a relatively high thermal conductivity, thermal resistance in a heat transfer path for dissipating heat through the conductive heat dissipation member 140 may be minimized.

Figure 17:
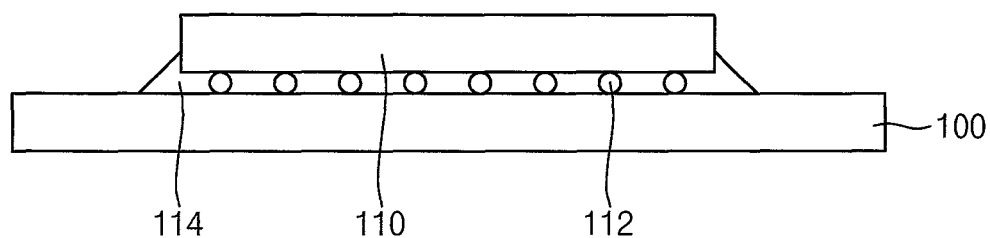
Figure 18:
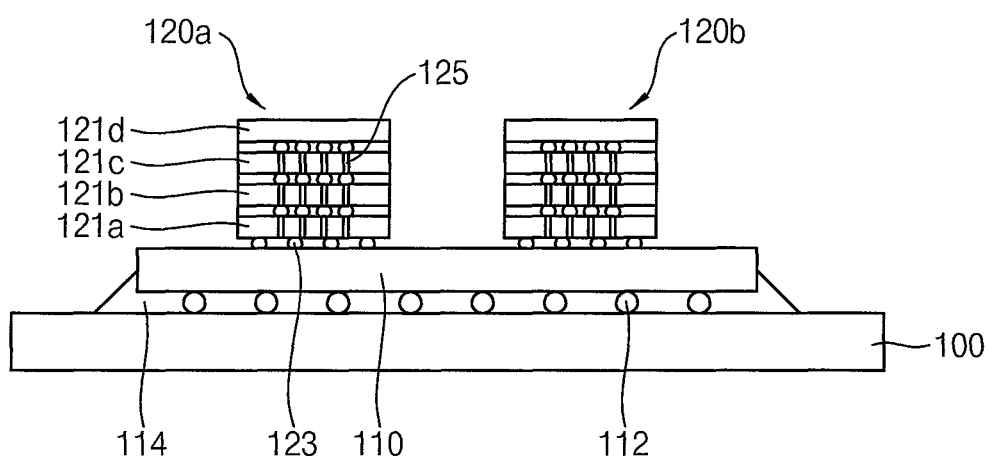

Hereinafter, a method of manufacturing the packaged semiconductor device in FIG. 16 will be explained with reference to FIGS. 17 to 21, which are cross-sectional views illustrating a method of manufacturing a packaged semiconductor device in accordance with example embodiments. Referring to FIGS. 17 and 18, the processes that are the same as (or similar to) processes as described hereinabove with reference to FIGS. 3 and 4, may be performed such that first and second semiconductor devices 110, 120a, 120b are formed on a package substrate 100.

In example embodiments, two second semiconductor devices 120a, 120b may be arranged on the first semiconductor device 110 to be spaced apart from each other.

The second semiconductor device(s) 120a, 120b may include a buffer die 121a and first to third memory dies 121b, 121c, 121d sequentially stacked on one another. The buffer die 121a and the first to third memory dies 121b, 121c, 121d may be electrically connected to each other by TSVs (through silicon vias) 125. The buffer die 121a and the first to third memory dies 121b, 121c, 121d may communicate date signals and control signals with each other through the TSVs 125. The buffer die 121a may be electrically connected to the first semiconductor device 110 by a plurality of conductive bumps 123.

Figure 19:
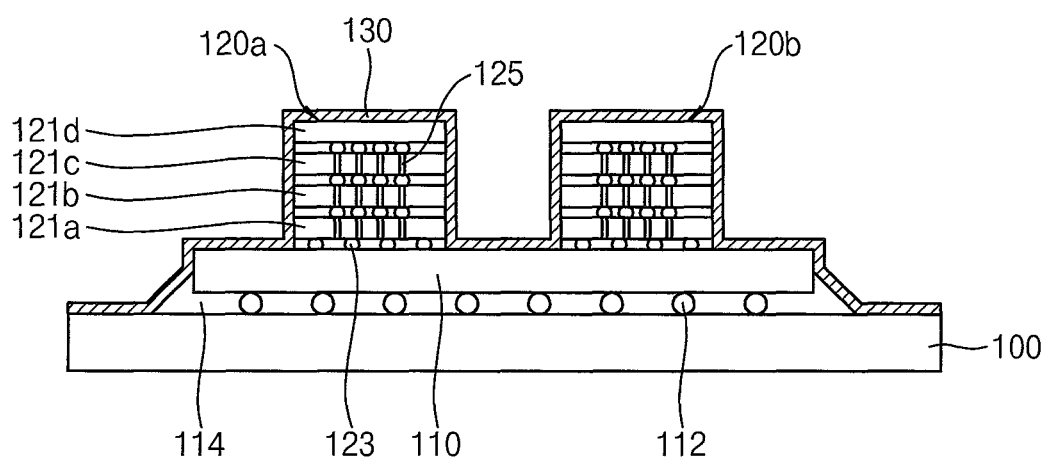
Figure 20:
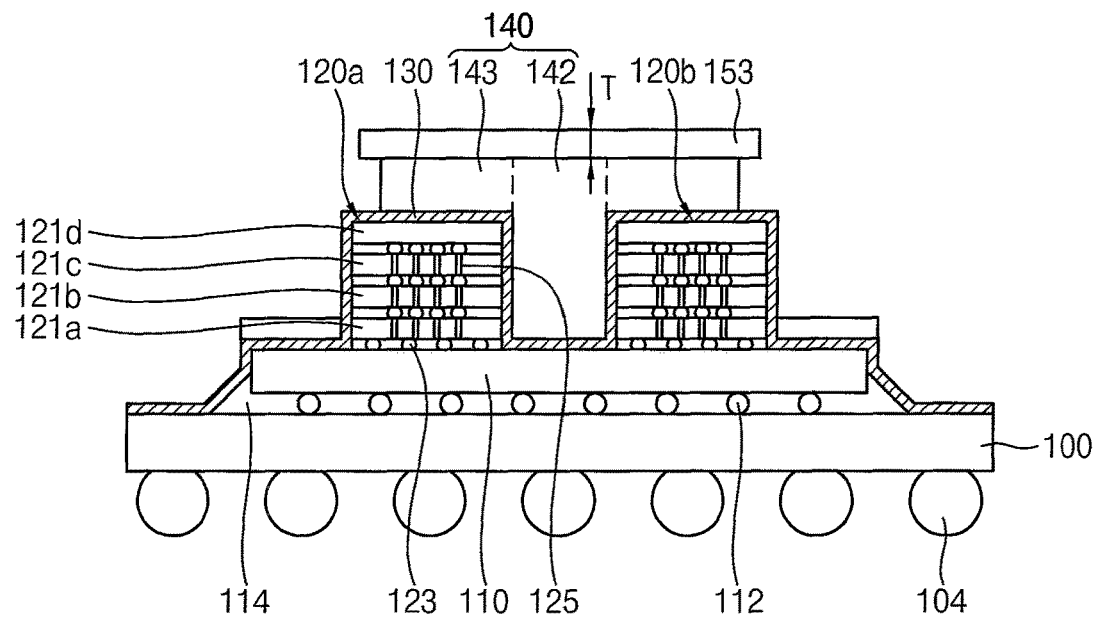

Referring to FIGS. 19 and 20, processes the same as or similar to processes as described with reference to FIGS. 5 and 6 may be performed such that a heat dissipating insulation layer 130 is coated on the first and second semiconductor devices 110, 120a, 120b. Then, a conductive heat dissipation member 140 may be formed to extend upwardly from the heat dissipating insulation layer 130 on the first and second semiconductor devices 110, 120a, 120b, and a first covering portion 153 may be formed on the conductive heat dissipation member 140.

In particular, after a metal paste is dispensed on the heat dissipating insulation layer 130 extending over the first semiconductor device 110 exposed by the second semiconductor device(s) 120a, 120b, and also on the heat dissipating insulation layer 130 extending over the second semiconductor device(s) 120a, 120b, a protective plate 153 as the first covering portion may be pressed on the metal paste, and then, the metal paste may be cured. Thus, the protective plate 153 may be formed on the conductive heat dissipation member 140 having first and second conducive heat dissipation members 142, 143.

The metal paste may be dispensed repeatedly using a dispenser to form the first and second conductive heat dissipation members 142, 143 having a desired shape at a desired location. The metal paste may include a conductive material having excellent thermal conductivity such as a metal such as gold (Au), silver (Ag), copper (Cu), etc.

The protective plate 153 may be formed directly on the conductive heat dissipation member 140 without an additional adhesive layer. The protective plate may have a thickness T of about 30 µm to about 150 µm. The protective plate may include a metal or polymer material having excellent thermal conductivity.

Figure 21:
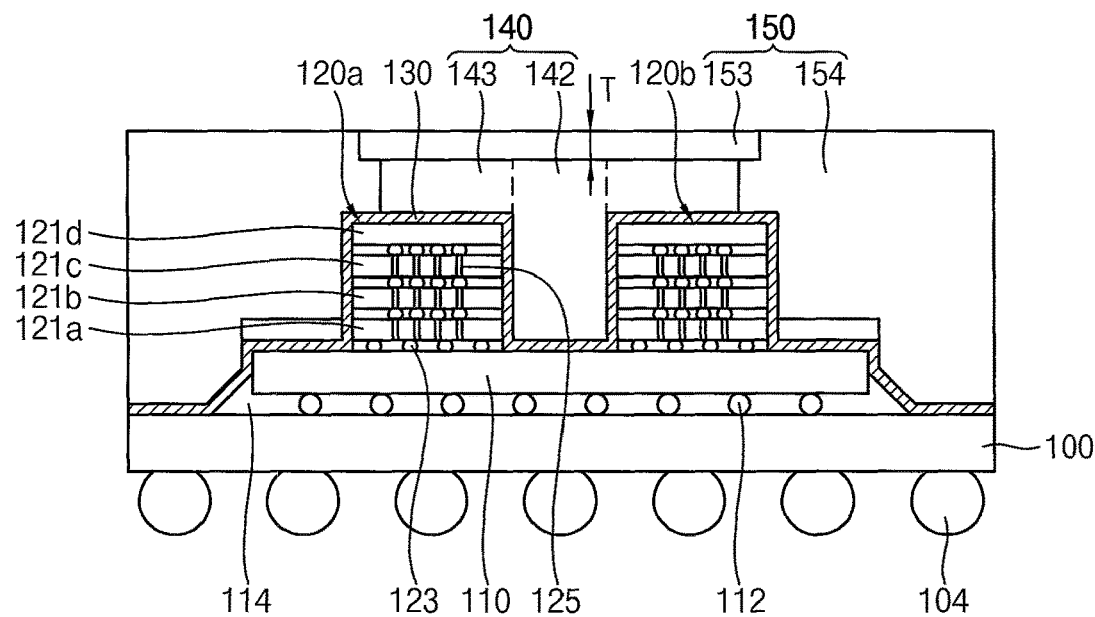

Referring to FIG. 21, a second covering portion 154 may be formed on an upper surface of the package substrate 100 to cover the first and second semiconductor devices 110, 120a, 120b and the first covering portion 153. Thus, a protective member 150 including the first and second covering portion 153, 154 may be formed. The protective member 150 may cover the first and second semiconductor devices 110, 120a, 120b and the conductive heat dissipation member 140.

An insulation material such as epoxy molding compound (EMC) may be coated on the upper surface of the package substrate 100, and the coated insulation material may be ground to expose an upper surface of the first covering portion 153. The second covering portion 154 may have a height the same as a height of the first covering portion 153 from the package substrate 100. Then, outer connection members 104 may be formed on outer connection pads on a lower surface of the package substrate 100 to complete the packaged semiconductor device 13 in FIG. 16.

An electronic device including a packaged semiconductor device in accordance with example embodiments may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like. The electronic device may be embodied by a personal computer PC or a portable electronic device such as a notebook, a cell phone, a personal digital assistant (PDA) and a camera.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A packaged semiconductor device, comprising:
   a package substrate;
   a first semiconductor device, which is flip-chip mounted on the package substrate;
   at least one second semiconductor device on the first semiconductor device, which partially covers the first semiconductor device;
   a plurality of bonding wires electrically coupling the at least one second semiconductor device to said package substrate;
   a heat dissipating insulation layer, extending as a coating on at least portions of the first and second semiconductor devices and on the plurality of bonding wires;
   a conductive heat dissipation member extending upwardly from the heat dissipating insulation layer, on at least portions of the first and second semiconductor devices but not on the plurality of bonding wires; and
   a protective member on the package substrate, which covers the first and second semiconductor devices and the conductive heat dissipation member, said protective member including a first covering portion covering an upper surface of the conductive heat dissipation member, and a second covering portion that covers side surfaces of the first semiconductor device and side surfaces of the at least one second semiconductor device and encapsulates the plurality of wire bonds.

2. The packaged semiconductor device of claim 1, wherein the first covering portion includes a plate, which makes contact with the upper surface of the conductive heat dissipation member.

3. The packaged semiconductor device of claim 2, wherein the plate has a plurality of through holes therein; and wherein the conductive heat dissipation member has protrusions which extend at least partially into the through holes in the plate.

4. The packaged semiconductor device of claim 2, wherein the protective plate comprises at least one of a metal and a polymer material.

5. The packaged semiconductor device of claim 1, wherein an upper surface of the first covering portion is coplanar with an upper surface of the second covering portion.

6. The packaged semiconductor device of claim 1, wherein the first covering portion has a first thermal conductivity, and the second covering portion has a second thermal conductivity greater than the first thermal conductivity.

7. The packaged semiconductor device of claim 1, wherein the first covering portion has a thickness in a range from about 30 µm to about 150 µm.

8. The packaged semiconductor device of claim 1, wherein the conductive heat dissipation member comprises:
   a first conductive heat dissipation member arranged on the heat dissipating insulation layer located on a portion of the first semiconductor device exposed by the second semiconductor device; and
   a second conductive heat dissipation member arranged on the heat dissipation insulation layer on the second semiconductor device.

9. The packaged semiconductor device of claim 8, wherein the second conductive heat dissipation member is contiguous with the first conductive heat dissipation member.

10. A packaged semiconductor device, comprising:
a package substrate;
a first semiconductor device arranged on the package substrate;
at least one second semiconductor device on the first semiconductor device, which partially covers the first semiconductor device;
a heat dissipating insulation layer extending as a coating on the first and second semiconductor devices;
a first conductive heat dissipation member extending on a portion of the heat dissipating insulation layer, which is located on an underlying portion of the first semiconductor device exposed by the second semiconductor device;
a second conductive heat dissipation member on another portion of the heat dissipation insulation layer that extends on the second semiconductor device; and
a protective member on the package substrate, which covers the first and second semiconductor devices and the first conductive heat dissipation member, said protective member including a first covering portion, which covers upper surfaces of the first and second conductive heat dissipation members, and a second covering portion, which covers side surfaces of the first and second semiconductor devices and the first covering portion;
wherein the upper surface of the first conductive heat dissipation member is coplanar with the upper surface of the second conductive heat dissipation member.

11. The packaged semiconductor device of claim 10, wherein the first covering portion includes a plate, which contacts the upper surfaces of the first and second conductive heat dissipation members.

12. The packaged semiconductor device of claim 11, wherein the plate has a plurality of through holes therein; and wherein the first conductive heat dissipation member has protrusions that extend at least partially into the through holes in the plate.

13. The packaged semiconductor device of claim 11, wherein the protective plate includes a material selected from a group consisting of metals and polymers.

14. An electronic device, comprising:
a substrate;
a first electronic product arranged on the substrate;
at least one second electronic product extending on, and partially covering, the first electronic product;
a plurality of bonding wires electrically coupling the at least one second electronic product to said substrate;
a heat dissipating insulation layer extending as a coating on the substrate, the first and second electronic products, and the plurality of bonding wires;
a conductive heat dissipation member extending upwardly from the heat dissipating insulation layer, and on portions of the first and second electronic products; and
a protective member on the substrate, which covers the first and second electronic products and the conductive heat dissipation member, said protective member including a first covering portion covering an upper surface of the conductive heat dissipation member and a second covering portion covering side surfaces of first and second electronic products and the first covering portion.

15. The electronic device of claim 14, wherein the first electronic product is configured to support higher maximum power consumption relative to the second electronic product.

16. The electronic device of claim 14, wherein the first covering portion includes a plate which makes contact with the upper surface of the conductive heat dissipation member.

17. The electronic device of claim 16, wherein the plate has a plurality of through holes therein; and wherein the conductive heat dissipation member has protrusions which extend at least partially into the through holes.

18. The electronic device of claim 14, wherein the first covering portion has a first thermal conductivity, and the second covering portion has a second thermal conductivity greater than the first thermal conductivity.

* * * * *